United States Patent [19]

Taylor

[11] 4,037,047

[45] July 19, 1977

[54] MULTILAYER CIRCUIT BOARD WITH INTEGRAL FLEXIBLE APPENDAGES

[75] Inventor: Glen J. Taylor, Winter Park, Fla.

[73] Assignee: Martin Marietta Corporation, Orlando, Fla.

[21] Appl. No.: 537,714

[22] Filed: Dec. 31, 1974

[51] Int. Cl.² .......................... H05K 1/14; H05K 3/30
[52] U.S. Cl. .................................... 174/68.5; 29/625; 156/629
[58] Field of Search ................... 174/68.5; 317/101 B, 317/101 CC, 101 CM, 101 D; 29/625, 626; 427/96; 117/212; 156/3, 13

[56] References Cited

U.S. PATENT DOCUMENTS

| | | | |
|---|---|---|---|
| 3,202,869 | 8/1965 | Matson et al. | 174/68.5 X |
| 3,221,095 | 11/1965 | Cook | 174/68.5 X |
| 3,346,415 | 10/1967 | Hachberger | 174/68.5 X |
| 3,393,392 | 7/1968 | Shelley | 174/68.5 X |
| 3,409,732 | 11/1968 | Dahlgren et al. | 174/68.5 |
| 3,471,348 | 10/1969 | Shaheen et al. | 174/68.5 X |

OTHER PUBLICATIONS

Ardito et al., IBM Technical Disclosure Bulletin, vol. 14, No. 3, Aug. 1971, pp. 701, 702.

*Primary Examiner*—Bruce A. Reynolds
*Attorney, Agent, or Firm*—Julian C. Renfro; Gay Chin

[57] ABSTRACT

Method and structure for creating multilayer printed circuit boards having integral flexible conductor appendages, involving the utilization of an array of flexible, circuit-containing layers bonded in properly aligned relationship between rigid layers equipped with suitable electrical connections. All of the layers are substantially larger than the size the finished circuit board is to be and selectively bonded and slotted in preselected locations, and maintained in this over-sized condition throughout the procedure in which holes for interconnections are drilled, and plated through with conductive material. Only after the plating procedure has been completed are the portions of the upper and lower rigid layers removed from locations above and below the appendage portions, thus allowing them to attain the desired, flexible condition. By keeping the rigid layers intact, the assemblage is maintained rigid during the plating procedure, thereby avoiding undesirable work hardening of the flexible portions even without tools for restraining the flexible portions. The selective bonding and preslotting permits the ready removal of the rigid material from certain portions of the assemblage to form the circuit board with integral flexible conductor appendages.

12 Claims, 4 Drawing Figures

MULTILAYER CIRCUIT BOARD WITH INTEGRAL FLEXIBLE APPENDAGES

BACKGROUND

For a number of years it has been known to provide a so-called "mother" board for supporting a plurality of circuit cards. Such a mother board is typically made in accordance with printed circuit techniques and contains a number of layers of circuitry. This is to say, by initially creating several discrete layers of circuit paths, interleaving them with bonding material, and then securing these layers together by the application of heat and pressure, a mother board of comparatively rigid material can be created.

The printed circuit cards supported on the mother board are each equipped with a large number of pins which are inserted into the mother board, with the arrangement being such that certain circuit portions on each card are connected to desired portions of the mother board, with the mother board having flexible appendages so as to ultimately connect certain cards to power supplies, discrete components, and the like.

It is necessary on the mother board to provide hole patterns to receive the pins of the numerous cards used thereon, and as is obvious, an appropriate electrical connection must be made between each received pin and the appropriate layer of the mother board. That this may be accomplished, the industry has for some years now utilized plated through holes in the mother board, and as is obvious, the plating must be sufficiently complete as to assure appropriate circuitry connections to each layer of the mother board to which continuity is required.

In order to assure the proper plating of the numerous holes appearing in the mother board, it is customary to work with the mother board having complete copper faces on both exterior portions, so that electrical continuity can be provided to each hole during the electroplating procedure. It is also typical to either move the board back and forth while suspended in the electrolytic material, or else agitate the fluid in a certain way so as to assure that each of the numerous holes of the mother board will be properly plated throughout its interior. Then, after the holes have been properly plated, the undesired portions of the copper faces on the exterior of the mother board are etched away so as to leave the desired hole portions.

Inasmuch as wiring harnesses made up of discrete wires is bulky as well as expensive, the industry, for a number of years now, has used flat conductor cables that are sufficiently flexible as to allow installation of the mother board in missiles and the like in which space is at a premium, which cables must conform to whatever paths are available between different portions of the missile. Typically, these flat conductor cables are also made by printed circuit techniques in which the circuit paths are encapsulated to prevent undesired shorting.

The flexible conductor cables were connected to the mother board at appropriate locations by the use of terminal pins, soldered joints, and the like, but in each instance in which these various techniques were used, many problems arose causing improper connections with the corresponding loss of continuity. In addition, much hand labor was involved, resulting in slow and expensive production.

Efforts in accordance with prior art teachings to create flexible appendages integral with a multilayer board, if indeed such were previously ever attempted, were doomed to failure because of the inability, prior to the present invention, of providing plated through holes not only in the mother board, but also in the termination portions of the flexible appendages, where connections were to be made to input and output devices, power supplies, discrete components, and the like. This statement is made because the flexible appendages, by their very nature, tend to undertake undesirable movements during the plating procedure, that are inconsistent with the proper plating of the holes therein.

SUMMARY

In accordance with the present invention, I advantageously marry together not only the rigid layers containing circuit paths that are to form portions of the mother board, but I also incorporate at the time of mother board manufacture, one or more oversize flexible layers, which not only carry the usual circuit paths, but also which include properly placed, flexible appendages, such that appendages integral with the mother board will be created at the time of manufacture of the mother board. That this may be effectively accomplished, I construct the layout for the mother board utilizing pieces of rigid material that are sufficiently oversize as to encompass the flexible appendages during drilling and hole plating procedures, with resort to this construction being in order to facilitate the creation of holes in the appendages that are properly plated through. Afterward, the rigid portions used to stabilize the flexible appendages are removed and discarded.

In other words, in the typical exercise of my invention, I work with rigid material that is as extensive in size as the finished mother board plus its terminations is to be, with circuits disposed on desired interior portions of the sandwich-type construction, and with complete copper faces remaining on the exterior surfaces of the sandwich. Then, after alignment of these layers and bonding them together by the utilization of heat and pressure, I proceed to drill holes in all of the locations appropriate for the mother board, and in all of the locations necessary for the terminations of the flexible appendages. Subsequently, I further process this assemblage in accordance with known printed circuit techniques, which techniques include placing the assemblage in electrolytic solution so that plating of the holes can be accomplished. Because of the presence of the rigid material throughout the whole extent of the assemblage, I do not need to be concerned about the appendages moving in an undesirable manner during the procedure in which the drilled holes are plated. This is to say, there will be no occasion for the flexible appendages to flop back and forth in the electrolytic solution and become work hardened, nor do I need to utilize expensive tooling in order to support the flexible appendages during the plating procedure, for the rigid material later to be removed as surplusage serves to support and stabilize each appendage portion of the assembly during the plating procedure.

After appropriate plated through holes have thus been created both in the mother board and in the terminations of the flexible appendages, I remove the entire assemblage from the plating tank and further process it in accordance with known procedures. It is important to note that in accordance with this invention, the surplus rigid material can be easily removed from the appendage locations so that they can attain the desired flexible condition, this being facilitated by a pre-slotting of the rigid material in preascertained locations. A router is the cutting implement typically used to bring about the removal of the unwanted rigid material. Mother boards of from three to ten layers have been created in accordance with this technique, involving from one to six flexible appendages.

It is important to note that I utilize several novel techniques in accomplishing the original layout of rigid and flexible materials prior to bonding them all together in one assemblage by the utilization of heat and pressure. One important technique involves the preslotting of the rigid material at each location where an appendage is to exit from what will eventually be a rigid composite laminate, as well as preslotting the rigid material at the locations where the terminations are to be created on the flexible appendages. This, of course, obviates the use of precision milling techniques in the removal of unwanted rigid material subsequent to the bonding and the hole plating operations.

Another technique employed involves the use of release film between flexible appendages and/or adhesive layers to preclude any unfavorable adhesion. The above-mentioned slots provide a built-in trim line for such film (adhesive or release) such that it can easily be removed from the flexible appendages over which it may have been superimposed.

Still another technique I employ involves cutting out the adhesive layers where they are superimposed over flexible appendages and inserting a sufficient thickness of release film to also act as an effective shim by being the same approximate thickness as the material cut out.

OBJECTS OF THE INVENTION

It is therefore a primary object of my invention to provide a highly effective technique for creating multilayer boards having integral flexible appendages thereon, with each appendage having an entirely suitable connector portion, permitting the proper connection of the appendage to other components.

It is another object of my invention to teach a highly effective process for creating mother boards having flexible appendages integral with the mother board from the time of manufacture and in such a manner that the flexible conductors will not be damaged during later manufacturing processing, thus obviating entirely the expense and uncertainty of adding flexible appendages to existing mother boards in accordance with present day techniques.

It is yet another object of my invention to create mother boards involving numerous bonded-together layers of printed circuit material in which it is desired to create plated-through holes, with the configuration of the components being plated being such as to enable all of the holes of the entire assembly to be plated properly, including the holes disposed at the terminations of the flexible appendages, without special tooling being necessary in order to hold the appendages in the proper position for plating.

It is still another object of my invention to provide a means whereby rigid printed circuit boards used in the makeup of multilayer mother boards are deliberately made oversize from the length and width standpoints to act as a built-in tool to hold the flexible circuit layers to be connected thereto such that portions later to become flexible appendages will be rigidized and not damaged during the subsequent hole plating procedure, with slots being appropriately provided in the rigid material such as will facilitate the later removal of rigid material at the locations where flexible appendages are being created, with this slotting entirely obviating the necessity of employing precision routing techniques in order to remove surplus rigid material.

These and other objects, features and advantages will be made more apparent to those skilled in the art from the following more detailed description and a study of the appended drawings.

BRIEF DESCRIPTION OF THE DRAWINGS

FIG. 4 is a fragmentary perspective view of a portion of an intermediate layer showing terminal portions of printed or etched flat conductors used in the circuits thereof.

DETAILED DESCRIPTION

Figure 1:
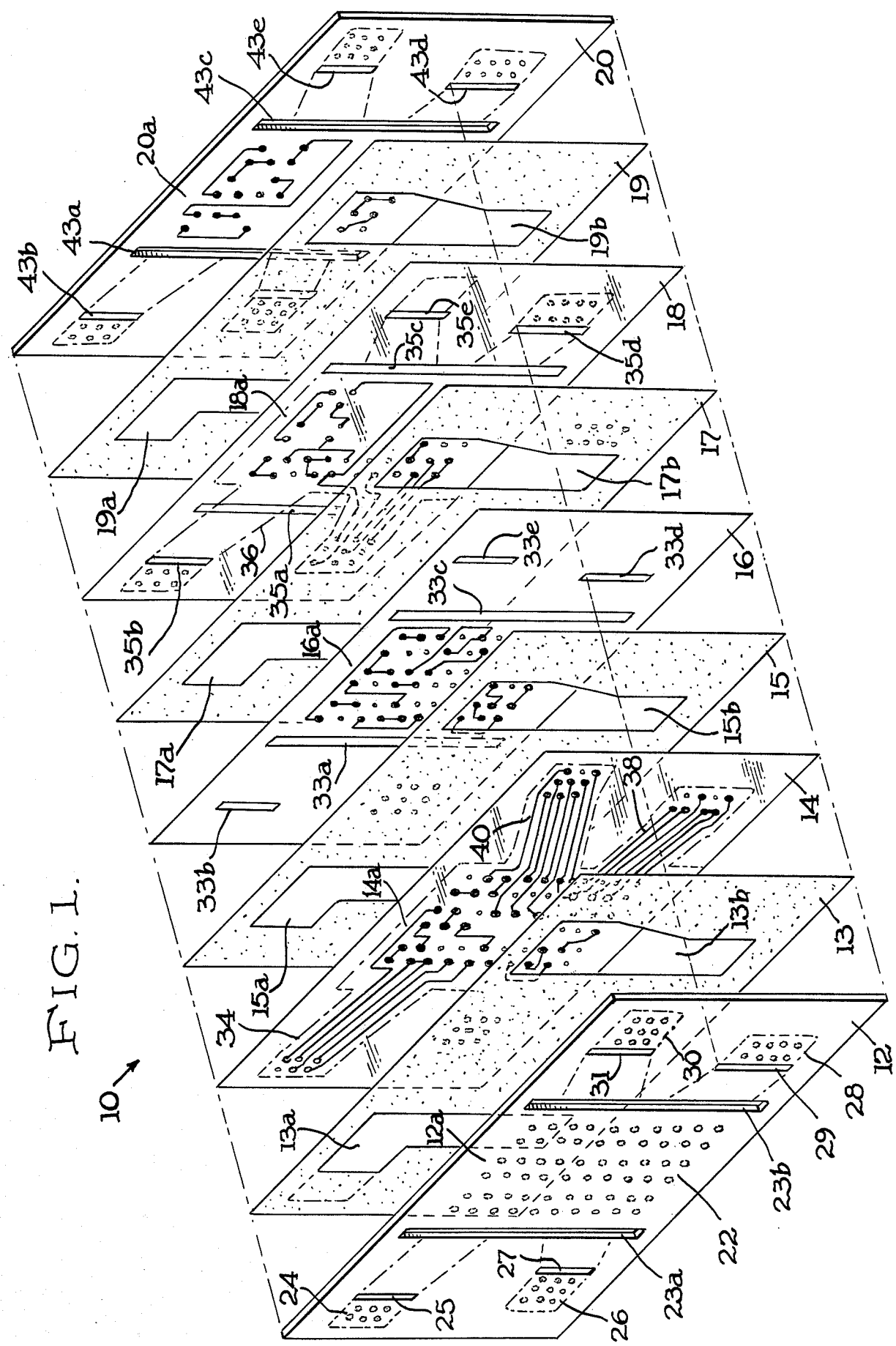
FIG. 1 is an exploded view of the first embodiment of the array showing the constituent layers before bonding.

Turning to FIG. 1, it will there be seen that I have depicted in exploded relation, an array 10 made up of a number of constituent layers 12 through 20 that serve to form, when bonded together, a so-called mother board that can be utilized in many applications such as in a missile. Typically, such mother board is to be used with a number of plug-in boards, not shown, each containing a number of circuits.

By the utilization of well known printed circuit techniques or the like, circuit configurations and circuit paths are placed on one or both sides of the layers 12 through 20 prior to their being placed in the arrangement shown in FIG. 1, and as is obvious, care has to be taken to assure the proper alignment of the circuits, circuit paths and terminal points of the various layers or components 12, 14, 16, 18 and 20 before they are bonded together by the application of heat and pressure, to form the finished mother board.

Layers 12 and 20 are of rigid material, such as of polyimide impregnated fiberglass, whereas intermediate flexible components or circuit layers 14, 16 and 18 are of flexible material, such as of flexible polyimide, mylar or other flexible films for it is desirable in accordance with this invention to form a plurality of flexible, circuit-carrying appendages at desired locations around the periphery of the mother board to be created, and such flexible appendages will be formed from these flexible layers.

Rigid layer 12 will be noted to have a number of holes grouped in its central portion 12a, which holes are in columns and rows so as to be able to receive the plug-in boards at a later time. This group of holes will hereinafter be referred to as the principal portion of the circuitry, which principal portion is bounded on its left and right sides by elongate slots 23a and 23b, respectively. In the upper left portion of board 12 is a group of holes, designated group 24, this group being bounded on the side toward central portion 22 by a slot 25. Similarly, a group 26 at the lower left is bounded by a slot 27, and on the other side of the central portion 12a are groups of holes 28 and 30, which groups are respectively bounded on the side toward the central portion 22 by slots 29 and 31.

It will be more apparent as the description proceeds how the principal portion 22 of board 12 becomes one of the two outer layers of the mother board being formed in accordance with this invention, whereas, the portions or groups of holes 24, 26, 28 and 30 become the desirably rigid termination portions of the flexible appendages created integral with the principal circuit board portion.

One side of layer 12 not visible in FIG. 1 may or may not contain printed circuit paths. It should also be noted with regard to layer 12 that although holes have been depicted in portions 22, 24, 26, 28 and 30, these holes are actually not drilled until all of the several layers have been properly aligned and then bonded together by the appropriate application of heat and pressure.

Layer 13 and the other odd numbered layers of the array 10 are flexible bonding layers, typically of polyimide, on both sides of which DuPont WA adhesive or the like had previously been applied. It is because of the adhesive carried by layer 13 that circuit-carrying layers 12 and 14 are caused to bond together and because of the adhesive carried by layer 15 that circuit layers 14 and 16 are caused to bond together, and so forth. Inasmuch as flexible appendages are to be created between the rigid central portions 12a of layer 12 and the peripherally located rigid terminations, comparatively large cutout areas 13a and 13b are provided in layer 13, with similar cutout areas 15a and 15b being provided in layer 15, 17a and 17b in layer 17, and 19a and 19b in layer 19. It is important to note that the right hand side of cutout 13a essentially corresponds with the right hand side of slot 23a, whereas the left hand stepped side of this cutout 13a essentially corresponds with the respective left sides of slots 25 and 27. Similarly, the left hand side of cutout 13b essentially corresponds with the left side of slot 23b, whereas, the lower and upper right hand sides of cutout 17b essentially corresponds with the location of the right sides of slots 29 and 31. These cutouts represent a selective withholding of bonding material so as to prevent bonding between layer 12 and those portions of layer 14 in which flexible appendages are to be created. Shims of a same thickness release film (not shown) may be used in these cutout areas in order to assure a proper thickness during the bonding procedure.

With regard to layer 14, it is important that this layer be of flexible material inasmuch as this layer is concerned with providing the integral flexible appendages 34, 38 and 40 to the finished board. Typically this layer is of polyimide upon which circuit paths had previously been created by well known printed circuit techniques and properly encapsulated by polyimide film and adhesive. Appendage portion 34 of layer 14 extends outwardly from the upper left part of the central circuit portion 14a terminates at a location corresponding to termination portion 24 depicted in layer 12. Quite obviously, proper circuit interconnections between the various layers of the finished board cannot be established unless the various layers are properly aligned, so it is to be understood that certain alignment and registration techniques are utilized at such time as the layers are to be bonded together. For example, this means that when the numerous holes are drilled in the bonded board, a given hole in central portion 12a of layer 12 will be located in the corresponding portion of the central portion 14a of layer 14, and similarly, a given hole in termination 24 of layer 12 will coincide with the termination of the appropriate circuit path associated with the appendage 34. Fragmentary FIG. 4 shows portions of two of the printed circuit conductor paths 21, 21a having enlarged terminal portions 21b and 21c respectively. These enlarged terminal portions are adapted to be drilled as aforesaid, the potential holes therein shown in dotted outline at 32. All the other circuit portions are, quite obviously, to be properly aligned where alignment is appropriate.

Further in this regard, the flexible intermediate circuit-carrying layers 14, 16 and 18, in their areas which are not designated to have appendage circuits thereon, may be provided with preformed slots corresponding to slots 23a, 23b, 25, 27, 29 and 31 in rigid end board 12. Otherwise no such slots are provided in the layers 14, 16 and 18, inasmuch as they would preclude establishment of the requisite circuit paths in the appendage portions. In FIG. 1, layer 16 on the left hand side includes slots 33a and 33b, and the right hand side includes slots 33c, 33d and 33e to correspond with the aforementioned slots 23a, 25, 23b, 29 and 31 respectively. Similar slots 35a–35e are shown in flexible layer 18, although it is understood that these slots are optional because the use of the cutting tool in the manner described herein will readily cut through these layers where necessary. Slots 43a–43e are shown in the other rigid end board 20, which correspond to the slots 23a, 25, 23b, 29 and 31 respectively in the rigid near end board 12. The dashed-dot broken lines shown between the slots 25, 27 and slot 23a, and slots 39, 31 and slot 23b designated the severance lines, which also carry around the various terminal hole groups 24, 26, 28 and 30. Corresponding broken line designations are shown on other of the intermediate and far end layers.

Thus, when all the holes have been drilled and a technique utilized that brings about the creation of plated-through holes, there will be appropriate electrical interconnections between corresponding parts of central portion 12a of board 12 and central portion 14a of board 14, as well as, of course, appropriate electrical interconnections between the respective central portions 16a, 18a and 20a of layers 16, 18 and 20. Inspection of FIG. 1 reveals that the circuit paths of these various central portions may differ from each other, as of course is to be expected, but the locations where the holes are to be located in the circuit paths must coincide from layer to layer.

It should now be abundantly clear why cutout portions 13a and 13b are created in layer 13, this being of course to prevent the flexible appendage portions 34, 38 and 40 from being bonded to the underside of layer 12 during the bonding procedure. Cutout portions 15a and 15b provided in bonding layer 15 likewise prevent the bonding of the appendages to layer 16, with the result that flexible appendages 34, 38 and 40 become completely free at the time the mother board is routed out, except that they will of course contain portions of rigid layer 12 at their outermost locations. This latter is made possible by the fact that bonding material remains at the locations of the outermost portions of each flexible appendage, thus causing the appropriate outermost portions of the respective appendages to bond to portions 24, 26, 38 and 30 of the rigid layer 12. The presence of this rigid material at these outer locations of the flexible appendages of course simplifies the task of properly interconnecting the flexible appendages to inputs, outputs, discrete components, power supplies or the like. However, there are instances in which it is desired to create flexible appendages that do not have rigid termination portions. In such instances, the areas of the endmost rigid boards either would be free of adhesive layers adjacent thereto, or may be provided with precut areas in the desired places, such as those corresponding to areas 24, 26, 28 and 30. Other suitable means may be used to preclude the formation of rigid terminations on the ends of the flexible appendages.

From the foregoing, it can be seen that by utilizing the pair of appropriately slotted rigid boards of appropriately oversize dimensions, a finished mother board complete with integral flexible circuitry and rigid support for the appendage terminations can be manufactured without damage to the flexible appendages since there will be no occasion for the flexible appendages to flop back and forth in the electrolytic solution and become work-hardened during the through hole plating operation. Furthermore, I have eliminated the necessity of extra tooling in order to support the flexible appendages during the plating procedure. When the plating operation is finished, the rigid boards are milled, taking advantage of the appropriately pre-located slots of the rigid boards to free the flexible appendages from their constraint. This is to say, the locations of the slots are such as to cause the flexible appendages to be freed of rigid material at such time as an appropriate cutting device, such as a saw or router, has been passed around the periphery of each appendage, such as shown in the broken outlines on the various layers, and with no precision milling being necessary.

From the foregoing it can also be seen that the teachings of the invention can be readily utilized to manufacture printed boards, other than mother boards, with flexible appendages and suitable rigid harnesses for the appendage terminations. To show this, attention is now directed to FIGS. 2 and 3.

Figure 2:
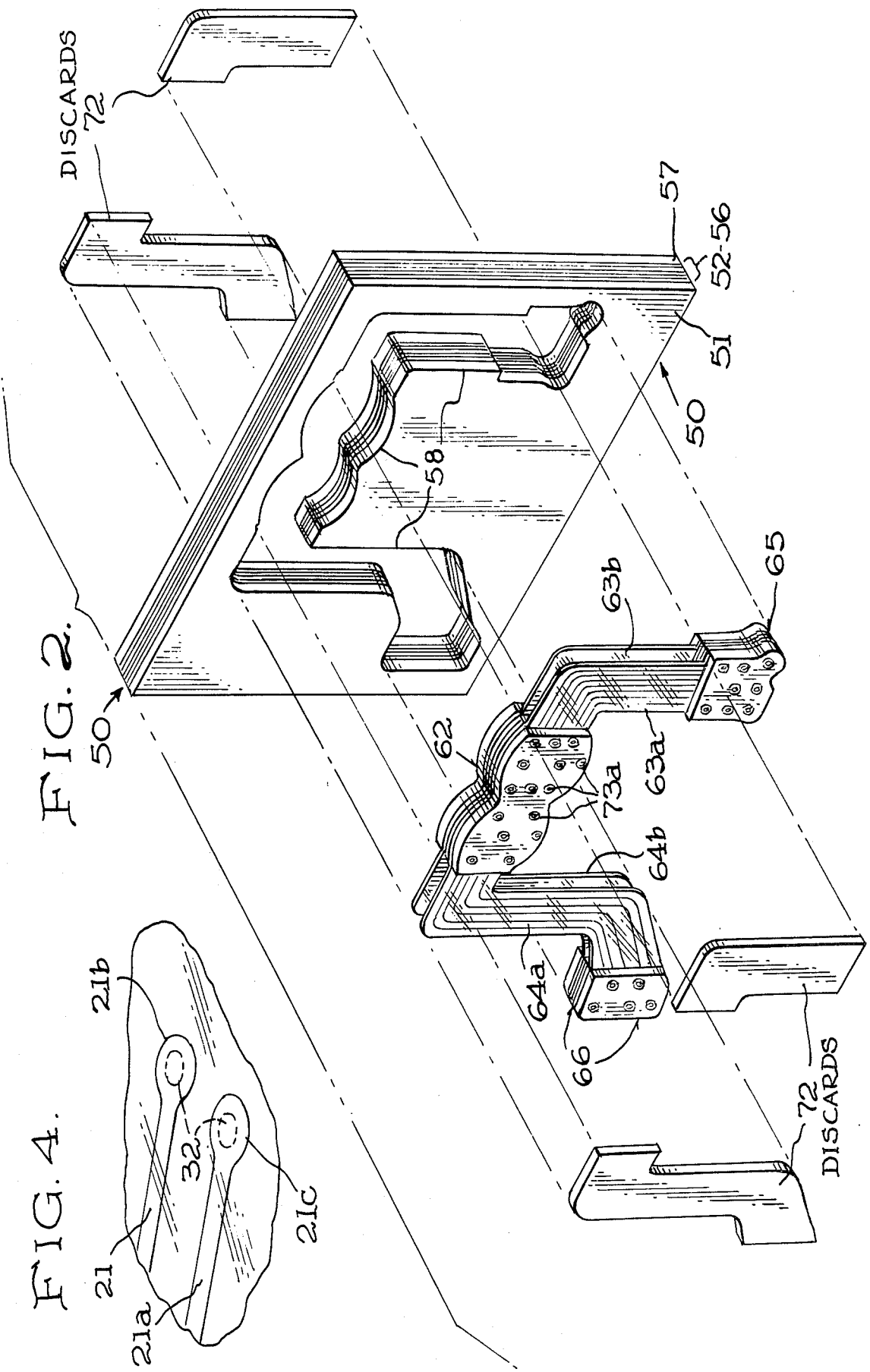
FIG. 2 shows a second embodiment of a bonded array milled to form the printed circuit boards and flexible appendages.
Figure 3:
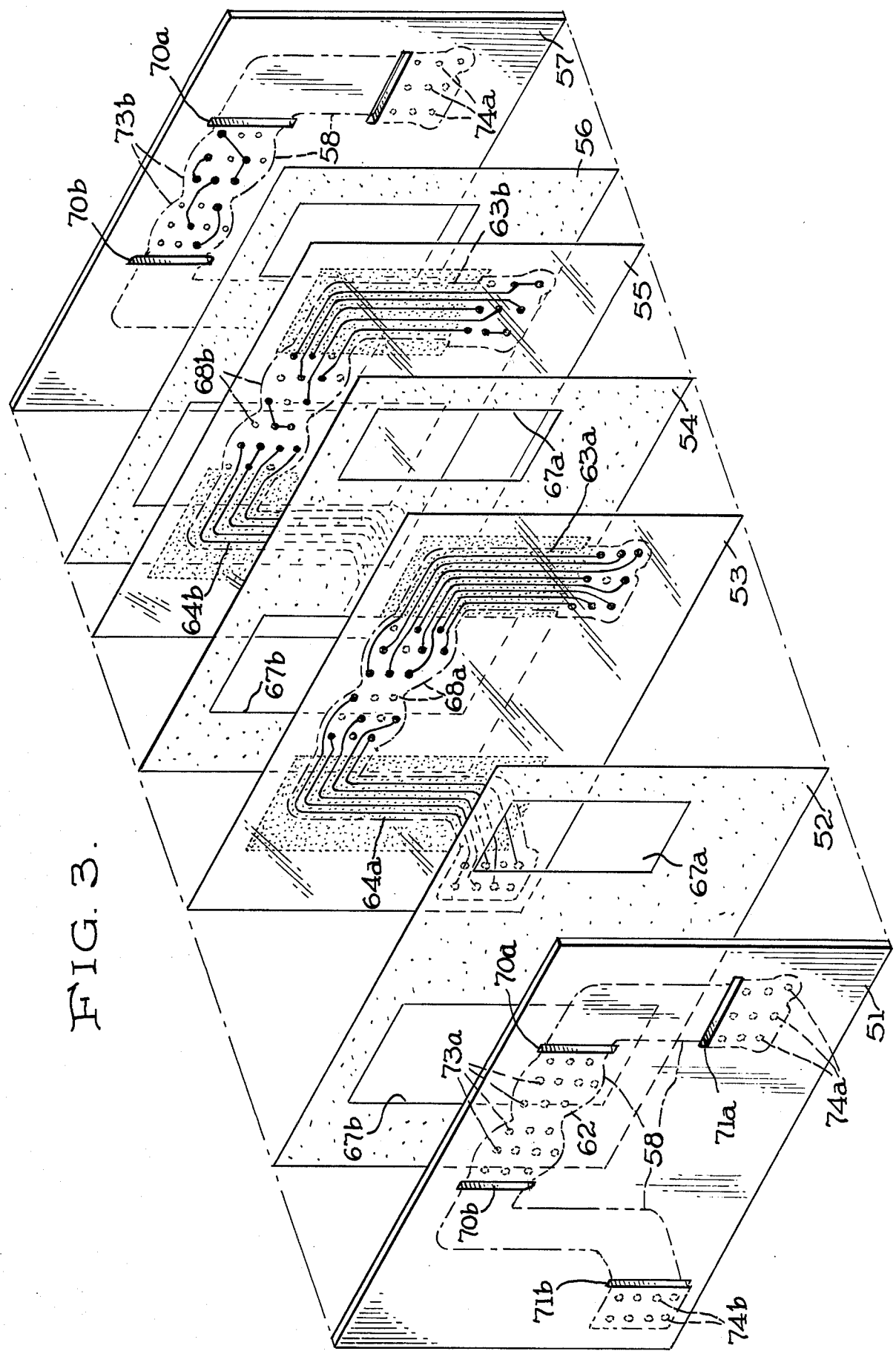
FIG. 3 is an exploded view of the plurality of layers before bonding to form the embodiment of FIG. 2

In FIG. 2 there is shown a finished array 50, of exaggerated thickness for the sake of illustrative clarity, comprised of the layers 51 through 57 shown in FIG. 3, and from which the principal portion or printed circuit board 62 with its integral flexible dual pairs of appendages 63a, 63b, 64a and 64b are formed, together with their rigid multilayer printed circuit boards 65 and 66 (FIG. 2). As shown in FIG. 3, the rigid outer boards 51 and 57 are oversize as compared to the finished product so as to include the principal portion 62, the various flexible appendages and the rigid terminal board portions or supports for the flexible appendages. The array 50 is formed in a manner described in connection with the first embodiment hereof, that intermediate odd-numbered layers 53 and 55 are flexible and have generally but not necessarily different circuit configurations and circuit paths formed thereon, together with groups of holes 68a and 68b (FIG. 3) located in the areas corresponding to the principal portion 62. Said flexible layers also have groups of holes also in the terminations of the flexible appendages, to coincide with similar holes placed in the rigid end boards 51 and 57 so that suitable through-hole connections may be made in the finished board. Similarly, bonding layers 52, 54 and 56 are provided with suitable adhesive thereon and with large cutout areas 67a, 67b (FIG. 3) in layer 52 and in similar layers in the bonding layers 54 and 56. These cutout areas, like those described in connection with the embodiment of FIG. 1 respectively include portions which align and correspond largely with slots 70a and 70b which bound the central principal portion 62 in the rigid boards 51 and 57, and also with slots 71a and 71b which bound the portions designated to be the rigid supports for the flexible termination in the rigid layers 51 and 57.

The layers of this embodiment may differ in number from those shown in FIG. 1 in order to provide the necessary layers to form the desired particular flexible appendages 63a, 63b and 64a, 64b.

It should also be pointed out at this time that the rigid boards 51 and 57 are respectively provided with suitable holes 73a and 73b (FIG. 3) in the principal portion 62 and with suitable holes 74a and 74b in the rigid terminations of the appendages to form a means of aligning the boards in a manner previously taught in connection with the embodiment of FIG. 1.

In FIG. 3, the appendage portions 63a, 64a of the flexible layers 53 and 55, can be desirably encapsulated by the use of a thin film such as depicted by the stippling around the appendages therein.

In this embodiment it is to be noted that the outer layers 51 and 57 are preferably provided with a complete picture or outline 58 so to speak, of the finished product to indicate the area to be routed, taking advantage of the precisely located slots to provide for the flexible appendages. In FIG. 2, the discard portions of the rigid end layers are designated 72, which represent the portions between the various slots 70a, 70b and 71a, 71b.

Thus, from the foregoing description in connection with FIGS. 2 and 3, it can be seen that the array 50 being oversize, permits the plating of the through-holes for the suitable connections to the various parts of the circuitry and the flexible appendages. The number of layers of the flexible and bonding material, as well as rigid material, can be selected according to the desired end results, and, as described in connection with FIG. 1, shims of flexible or bonding material may be used where additional fill and support is necessary for the array during the pressing and heating step.

Finally, it can be seen that numerous embellishments of printed circuit boards and flexible appendages are possible once having understood the teachings of my invention. Reference should be made to the appended claims for a definition of the claimed invention.

What is claimed is:

1. As an article of manufacture, a multilayer printed circuit board having an integral flexible web type conductor appendage comprising at least one flexible circuit-containing layer having at least one flexible appendage, a pair of rigid layers aligned in a predetermined manner with said at least one flexible layer and having electrical connections to the circuits on said at least one flexible layer, said rigid layers being bonded to the opposite sides of said at least one flexible layer in all areas except in locations in which said flexible appendage is located, said rigid layers being substantially oversize and holding said flexible appendage substantially rigid during the manufacturing procedure in which holes were drilled in said bonded array and thereafter plated through forming said electrical connections, said rigid layers being slotted at the location representing the beginning of said at least one flexible appendage and generally overlying the flexible circuit-containing layer, to enable the liberation of such flexible appendage subsequent to the plating operation by the utilization of a cutting device moved around the periphery of such appendage.

2. The article of manufacture as defined in claim 1 in which said rigid layers are pre-slotted adjacent to and preceding an outermost end of termination of said appendage, whereby portions of said rigid layers intermediate said respective slots disposed at the beginning and near the outermost end of termination, are adapted to be readily removable by the said utilization of a cutting device which intercepts said respective slots during cutting travel thereof.

3. The article of manufacture as defined in claim 1 having a plurality of the integral flexible conductor appendages and comprising an aligned plurality of the flexible circuit-containing layers, at least some of which have flexible appendages; and said rigid layers being preslotted at the locations representing the beginning of each of said flexible appendage.

4. The article of manufacture as defined in claim 3 in which said rigid layers are also preslotted adjacent to and preceding an outermost end of the terminations of said flexible appendages.

5. A method of creating a multilayer printed circuit board having integral flexible conductor appendages, comprising the steps of creating a plurality of circuit-containing flexible layers with at least some of said layers including an appendage portion, creating a pair of rigid layers having electrical interconnection areas and capable of being aligned with said flexible layers so as to subsequently bring about the completion of a number of desired electrical paths, slotting said rigid layers at locations corresponding to the positions of said appendages, bonding said rigid layers to opposed sides of said plurality of flexible layers in sandwich fashion, thus maintaining said appendage portions temporarily nonflexible, and with no bonding occurring between said rigid layers and said flexible appendage portions, creating holes in a number of said connection areas in the resulting laminate, immersing the bonded laminate in a metal plating solution for a sufficient length of time in a manner as to form a metallic coating on the walls of such holes, and releasing said flexible appendages from their temporary nonflexible conditions subsequent to the plating operation by utilizing a cutting device and cutting through said sandwiched layers around the periphery of such flexible appendages and to said slots formed in said rigid layers and then removing the portions of said rigid layers freed by such cutting action.

6. The method as defined in claim 5 in which a router is the cutting device utilized.

7. A method of creating a multilayer circuit board array having integral flexible appendages, comprising the steps of:
creating circuitry on at least one layer of flexible material that includes at least one appendage portion, with such circuitry having interconnection points at pre-ascertained locations thereon and with respect to which points, subsequent electrical interconnection of at least some of such points with corresponding points of other layers of the array may be made,
creating rigid layers between which said at least one flexible layer can be bonded, each of said rigid layers having interconnection points thereon at locations alignable with corresponding interconnection points on the other layers of the array,
at least some of said layers having a series of closely spaced interconnection points thereon defining the principal portion of the multi-layer circuit board being created, each of said rigid layers being of greater dimension than the finished multilayer board is to be,
slotting said rigid layers along at least some of the boundaries that define the commencement of said at least one appendage portion,
applying adhesive at selected locations between said rigid and flexible layers so that said principal portions of all of said layers can be bonded together after alignment of the layers, and with no adhesive being used in conjunction with said at least one appendage portion, where the integral flexible appendage is to be created,
aligning all of said layers, and then applying heat and pressure to said layers to bond said layers at said selected locations,
creating holes in a number of said interconnection points, and thereafter plating such holes in order to create electrical connections between the layers at such points, and
thereafter removing portions of said rigid layers at locations corresponding to the appendages to be created, such removal of portions of said rigid layers being facilitated by the placement of the slots and the absence of adhesive.

8. The method of creating a multilayer circuit board as claimed in claim 7 including the step of also slotting said rigid layers generally transversely of said flexible appendages to define the area of termination of the flexible appendages and wherein the removal of portions of said rigid layers to free said flexible appendages of constraint is facilitated by the placement of the slot and the absence of adhesive between the principal portion and the area defining the termination of the appendages.

9. A method of creating a multilayer circuit board having integral flexible appendages comprising the steps of:
creating circuitry on a plurality of similar size layers of flexible material with such circuitry having numerous interconnection points at preascertained locations thereon and with respect to which points, subsequent electrical interconnection of at least some of such points on each layer with corresponding points of other layers may be made,
creating a pair of rigid layers between which said flexible layers can be bonded by the use of adhesive and the application of heat and pressure, with each of said rigid layers having numerous interconnection points thereon, disposed at locations alignable with corresponding interconnection points on the other layers,
all of said layers having a series of closely spaced interconnection holes therethrough, serving to define the principal portion of the multilayer circuit board being created and to define termination portions for appendages, each of said flexible and rigid layers being of greater dimension than the finished multilayer board is to be with said rigid layers being slotted along at least some of the boundaries generally transversely of said flexible circuitry,
applying adhesive at selected locations between said rigid and flexible layers so that said principal portions and termination portions of all of said layers can be bonded together and with no adhesive at locations between the principal portions and the termination portions so that said flexible appendages can be created,
aligning said flexible and rigid layers and bonding the same together by heat and pressure, and thereafter removing portions of said rigid layers at locations corresponding to the appendages to be created, such removal of unwanted rigid material being facilitated by the placement of the slots and the absence of adhesive.

10. As an article of manufacture, a multilayer circuit board with flexible connector leads and lead harness therefor comprising:
- a pair of rigid outer layers with a plurality of holes located in groups defining a principal portion and terminal portions, said principal portion forming the circuit board and the terminal portions forming the harness, at least one flexible layer sandwiched between said rigid layers and containing conductive lead lines between the principal portion and the terminal portion electrically connecting selected holes in said principal portion with selected holes in said terminal portion,
- slots in said rigid layers located between the boundaries of said principal portion and said terminal portions generally transverse to said conductive lead lines,
- said rigid layers being bonded to said at least one flexible layer at the principal portion and the terminal portions, said flexible conductive lead lines being constrained by said rigid layers in the areas between said slots until said rigid layers are cut to define the multilayer circuit board and to free said at least one flexible layer to form the flexible connector leads.

11. A method of making a rigid multilayer circuit board with flexible appendages attached thereto comprising the steps of:
- creating circuitry on at least one layer of flexible material that includes at least one appendage portion, with such circuitry having conductor leads as well as interconnection points at pre-ascertained locations thereon and with respect to which points, subsequent electrical interconnection of at least some of such points with corresponding points of other layers of the array may be made,
- forming at least a pair of rigid layers of a size larger than the intended size of the finished circuit board, between which rigid layers, at least one flexible layer can be bonded, each of said rigid layers having interconnection points thereon at locations alignable with corresponding interconnection points on the other layers of the array,
- at least some of said layers having a series of closely spaced interconnection points thereon defining the principal portion of the multilayer circuit board being created,
- forming slots of a desired length and at designated locations on said rigid layers, at the periphery of said principal portion,
- placing at least one layer of flexible material with conductor leads formed thereon between a pair of rigid layers, with a portion of said conductor leads being juxtaposed to the circuitry of a rigid layer, and with certain portions of said at least one layer of flexible material extending beyond the slots in at least some locations, to form a basis for flexible appendages,
- placing adhesive between said rigid layers and said at least one flexible layer in all areas except where the flexible appendages are to be created,
- aligning said layers and then bonding said rigid layers to said flexible layers to form said multilayer board, with conductor leads confined therein,
- creating holes through a number of said interconnection points, and
- thereafter removing portions of said rigid layers from locations outside said principal portion, thus to complete the creation of flexible appendages, such removal of portions of said rigid layers being facilitated by the placement of the slots and the absence of adhesive.

12. The method as claimed in claim 11 wherein the circuitry on said rigid layers is connected to said conductor leads for electrical continuity therebetween by plating the through-holes with electrical conductive material.

* * * * *